United States Patent [19]
Yoshida

[11] Patent Number: 5,299,145
[45] Date of Patent: Mar. 29, 1994

[54] ADDER FOR REDUCING CARRY PROCESSING

[75] Inventor: Yukihiro Yoshida, Ikoma, Japan

[73] Assignee: Sharp Kabushiki Kaisha, Osaka, Japan

[21] Appl. No.: 903,331

[22] Filed: Jun. 24, 1992

[30] Foreign Application Priority Data

Sep. 12, 1991 [JP] Japan ................................. 3-233219

[51] Int. Cl.$^5$ .............................................. G06F 7/50
[52] U.S. Cl. .................................... 364/746.2; 364/768
[58] Field of Search ....................... 364/746.2, 768, 786

[56] References Cited

U.S. PATENT DOCUMENTS

| | | | |
|---|---|---|---|
| 4,620,188 | 10/1986 | Sengchank | 364/746.2 |
| 4,866,657 | 9/1989 | Shigeo et al. | 364/746.2 |
| 4,914,614 | 4/1990 | Yamakawa | 364/746.2 |
| 4,979,140 | 12/1990 | Darley | 364/746.2 |

OTHER PUBLICATIONS

Morris, et al., "An Introduction to the Ternary Code Number System" *Electronic Engineering* Sep. 60 pp. 554-557.

*Primary Examiner*—David H. Malzahn

[57] ABSTRACT

An adder including a subdividing unit for subdividing an addend and an augend formed in plural bits into bit groups each having a specified number (an integer of 2 or larger) of bits, and an addition unit for executing parallel addition for each of the bit groups. The addition unit is arranged such that the addend and the augend are added together for each bit when they are represented in multivalued logic having three or more steps of logic values.

9 Claims, 17 Drawing Sheets

Fig.5

WHEN $\overline{C}=1$

|      | $X_0$ | $X_{1/3}$ | $X_{2/3}$ | $X_1$ |
|------|-------|-----------|-----------|-------|
| $Y_0$     |   | 1 | 2 | 3 |
| $Y_{1/3}$ | 1 | 2 | 3 |   |
| $Y_{2/3}$ | 2 | 3 |   | 1 |
| $Y_1$     | 3 |   | 1 | 2 |

Fig.6

WHEN $C=1$

|      | $X_0$ | $X_{1/3}$ | $X_{2/3}$ | $X_1$ |
|------|-------|-----------|-----------|-------|
| $Y_0$     | 1 | 2 | 3 |   |
| $Y_{1/3}$ | 2 | 3 |   | 1 |
| $Y_{2/3}$ | 3 |   | 1 | 2 |
| $Y_1$     |   | 1 | 2 | 3 |

Fig.7

WHEN $\overline{C}=1$

|  | $X_0$ | $X_{1/3}$ | $X_{2/3}$ | $X_1$ |
|---|---|---|---|---|
| $Y_0$ |  |  |  |  |
| $Y_{1/3}$ |  |  |  | 1 |
| $Y_{2/3}$ |  |  | 1 | 1 |
| $Y_1$ |  | 1 | 1 | 1 |

Fig.8

WHEN $C=1$

|  | $X_0$ | $X_{1/3}$ | $X_{2/3}$ | $X_1$ |
|---|---|---|---|---|
| $Y_0$ |  |  |  | 1 |
| $Y_{1/3}$ |  |  | 1 | 1 |
| $Y_{2/3}$ |  | 1 | 1 | 1 |
| $Y_1$ | 1 | 1 | 1 | 1 |

$(N = 2^m, m = 1, 2, 3, 4, \cdots)$

ADDER FOR REDUCING CARRY PROCESSING

BACKGROUND OF THE INVENTION

1. Field of the Invention

This invention relates to an adder.

2. Description of the Related Art

A device having a computer which includes a logical operation unit, a microprocessor, for example, such as a personal computer, a POS (Point of Sales) terminal, and a cash register, includes an adder for executing various logical operations.

With the increase of the speed in bit signal processing, the number of stages of gates of the adder is increasing. This causes delays of signals, which makes it difficult to perform additions stably.

SUMMARY OF THE INVENTION

It is therefore an object of the present invention to provide an adder which solves the above-mentioned problem and which can perform additions stably regardless of signal delays which occur with the increase of the number of gate stages.

In order to achieve the above object, the adder according to the present invention comprises subdividing means for subdividing an addend and an augend, formed in plural bits, into bit groups each having a specified number (an integer of 2 or larger) of bits, and addition means for executing parallel addition for each of said bit groups, said addition means being arranged such that an addend and an augend are added together for each bit when the addend and the augend are represented in multivalued logic having three or more steps of logic values.

The above-mentioned adder executes 2-bit parallel addition by subdividing an addend and an augend in the form of binary bits for every two bits, for example, when they are inputted, and outputs a carry and a result of addition. When multivalued, e.g. quaternary addend and augend are inputted, they are converted into binary forms, and parallel addition is performed on those binary data. Therefore, the number of times of carry processing can be reduced by half, so that the clock pulse frequency can be reduced by half without reducing the operation speed.

Further objects and advantages of the present invention will be apparent from the following description of the preferred embodiments of the invention as illustrated in the accompanying drawings.

BRIEF DESCRIPTION OF THE DRAWINGS

FIG. 5 is a diagram showing addition results in tabular form of the adder of FIG. 1;

FIG. 6 is a diagram showing addition results in tabular form of the adder of FIG. 1;

FIG. 7 is a diagram showing carry outputs in tabular form of the adder of FIG. 1;

FIG. 8 is a diagram showing carry outputs in tabular form of the adder of FIG. 1;

DESCRIPTION OF THE PREFERRED EMBODIMENTS

Figure 2:
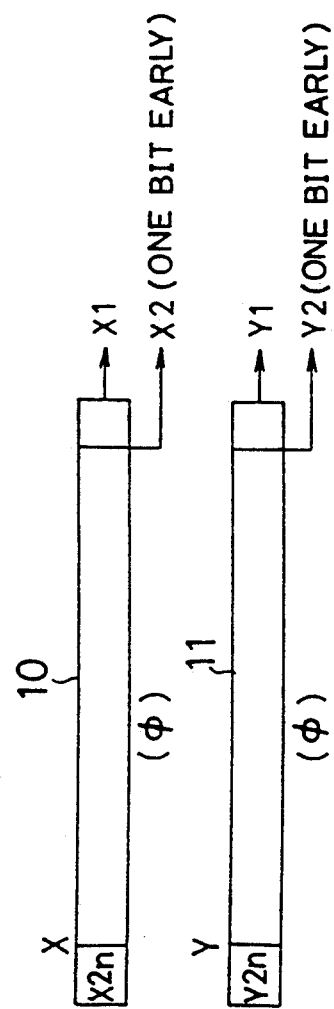
FIG. 2 is a diagram showing registers for storing words to be added of the adder of FIG. 1.

Description will first be made of a 2-bit parallel-serial adder for adding 2n-bit words X and Y stored respectively in registers 10 and 11 shown in FIG. 2 as a first embodiment of the present invention. In FIG. 2, X1 and Y1 represent bit data sequentially outputted from the registers 10 and 11, while X2 and Y2 represent bit data which lead the bit data X1 and Y1 by one bit respectively.

Figure 3:
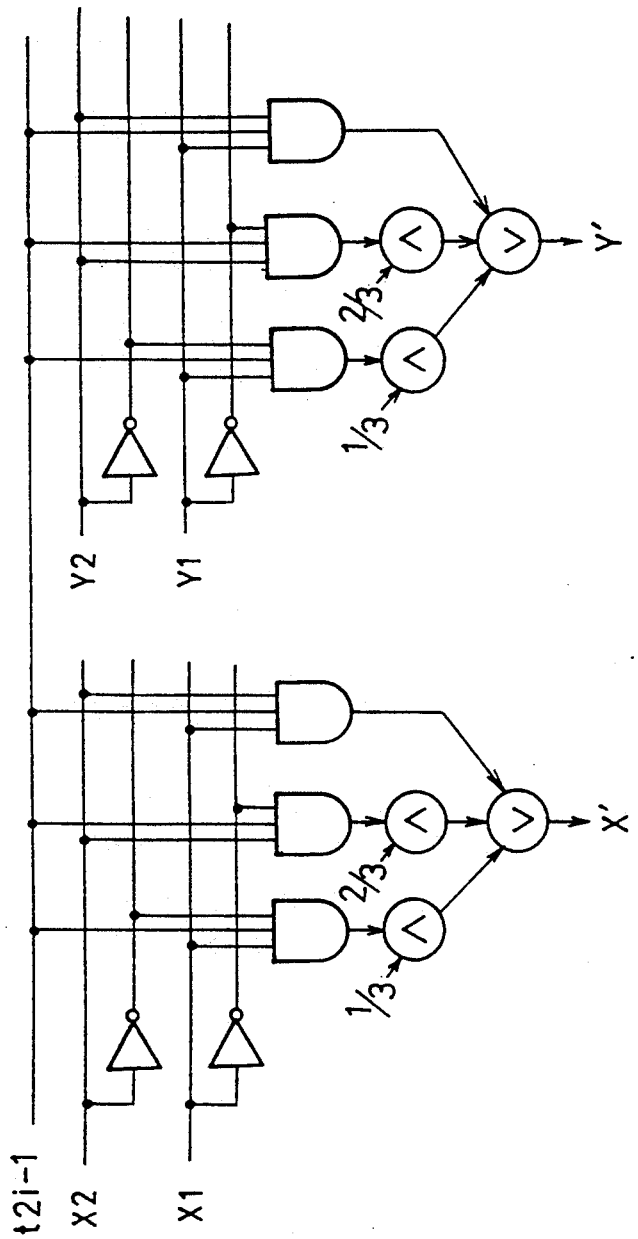
FIG. 3 is a circuit diagram of a binary (two-value)/-quaternary (four-value) conversion circuit of the adder of FIG. 1.

X1, X2 and Y1, Y2 are converted into quaternary data X' and Y' by binary-quaternary conversion circuits each constituted by inverters, AND circuits and an OR circuit as shown in FIG. 3. The symbol $\wedge$ denotes a quaternary AND circuit, while the symbol $\vee$ denotes a quaternary OR circuit. This binary-quaternary conversion circuit executes expressions as follows.

$$X' = \tfrac{1}{3} \cdot X2 \cdot X1 + \tfrac{2}{3} \cdot X2 \cdot \overline{X1} + X2 \cdot X1 \quad (1)$$

$$Y' = \tfrac{1}{3} \cdot Y2 \cdot Y1 + \tfrac{2}{3} \cdot Y2 \cdot \overline{Y1} + Y2 \cdot Y1 \quad (2)$$

Table 1 shows the relation between the binary bit data X1, X2 and the quaternary bit data X', and the relation between the binary bit data Y1, Y2 and the quaternary bit data Y'.

TABLE 1

| X2 | X1 | Y2 | Y1 | X' | Y' |
|---|---|---|---|---|---|
| 0 | 0 | 0 | 0 | 0 | 0 |
| 0 | 1 | 0 | 1 | $\tfrac{1}{3}$ | $\tfrac{1}{3}$ |
| 1 | 0 | 1 | 0 | $\tfrac{2}{3}$ | $\tfrac{2}{3}$ |
| 1 | 1 | 1 | 1 | 1 | 1 |

Figure 4:
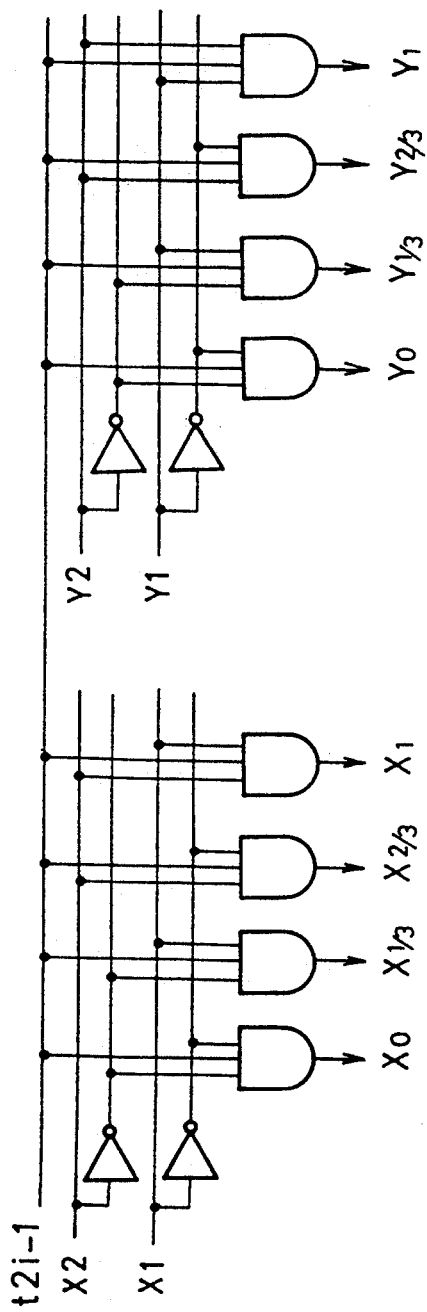
FIG. 4 is a circuit diagram of a binary input circuit of the adder of FIG. 1.

When binary logic is used instead of quaternary logic, a binary input circuit shown in FIG. 4 can be used instead of the binary-quaternary conversion circuit shown in FIG. 3.

Assuming that $X_0$, $X_{\frac{1}{3}}$, $X_{\frac{2}{3}}$ and $X_1$ are bits which are 1 when quaternary data $X'$ is 0, $\frac{1}{3}$, $\frac{2}{3}$ and 1 respectively and which are 0 when the quaternary data $X'$ is other than those values, and that $Y_0$, $Y_{\frac{1}{3}}$, $Y_{\frac{2}{3}}$ and $Y_1$ are bits which are 1 when quaternary data $Y'$ is 0, $\frac{1}{3}$, $\frac{2}{3}$ and 1 respectively, and which are 0 when the quaternary data $Y'$ is other than those values. The results of addition between $X'$ and $Y'$ can be expressed in tabular form as shown in FIG. 5 when there is no carry output C from a lower stage, and can be expressed in tabular form as shown in FIG. 6 when there is a carry output C from the lower stage. In FIGS. 5 and 6, "1" represents "01", "2" represents "10", and "3" represents "11".

Carry outputs can be expressed in tabular form as shown in FIG. 7 when there is no carry output C from the lower stage, and can be expressed in tabular form as shown in FIG. 8 when there is a carry output C from the lower stage. Therefore, the carry output C to the upper stage can be expressed by the following logical expression.

$$C = \{(X_0 \cdot Y_1 + X_1 \cdot Y_0 + X_{\frac{1}{3}} \cdot Y_{\frac{2}{3}})C + (X_1 + Y_1 + X_{\frac{2}{3}} + Y_0 + X_0 \cdot Y_{\frac{2}{3}})C\}t2i - 1 + Ct2i \quad (3)$$

When addition results between $X'$ and $Y'$ are represented by two binary bits, the lower bit Z1 and the higher bit Z2 can be expressed by logical expressions as follows.

$$\begin{aligned}
Z2 &= \{(Y_{\frac{2}{3}} + Y_1)(X_1 \cdot C + X_0 \cdot C) + (Y_{\frac{1}{3}} + Y_{\frac{2}{3}}) \quad (4)\\
&\quad (X_{\frac{2}{3}} \cdot C + X_0 \cdot C) + (Y_0 + Y_{\frac{2}{3}})(X_{\frac{1}{3}} \cdot C + \\
&\quad X_{\frac{1}{3}} \cdot C) + (Y_1 + Y_0)(X_1 \cdot C + X_{\frac{2}{3}} \cdot C)\} t2i - 1
\end{aligned}$$

$$\begin{aligned}
Z1 &= (Y_{\frac{1}{3}} + Y_1)\{(X_0 + X_{\frac{2}{3}}) C + (X_{\frac{1}{3}} + \quad (5)\\
&\quad X_1) C\} t2i - 1 + (Y_0 + Y_{\frac{2}{3}})\{(X_{\frac{1}{3}} + X_1) C + \\
&\quad (X_0 + X_{\frac{2}{3}}) C\} t2i - 1
\end{aligned}$$

Addition is carried out in blocks of two bits in parallel at time $t \, 2i-1$ ($i=1, 2, 3, \ldots$). Therefore, logic AND by $t \, 2i-1$ is included in the expressions (3), (4) and (5). Further, since a carry output occurs at time $t \, 2i$, and it is added at the next time $t \, 2i-1$, the term $C \, t \, 2i$ is included in the expression (3). The addition output Z is obtained by delaying the above-mentioned Z2 by one bit, and by adding Z1 to the delayed Z2.

Figure 1:
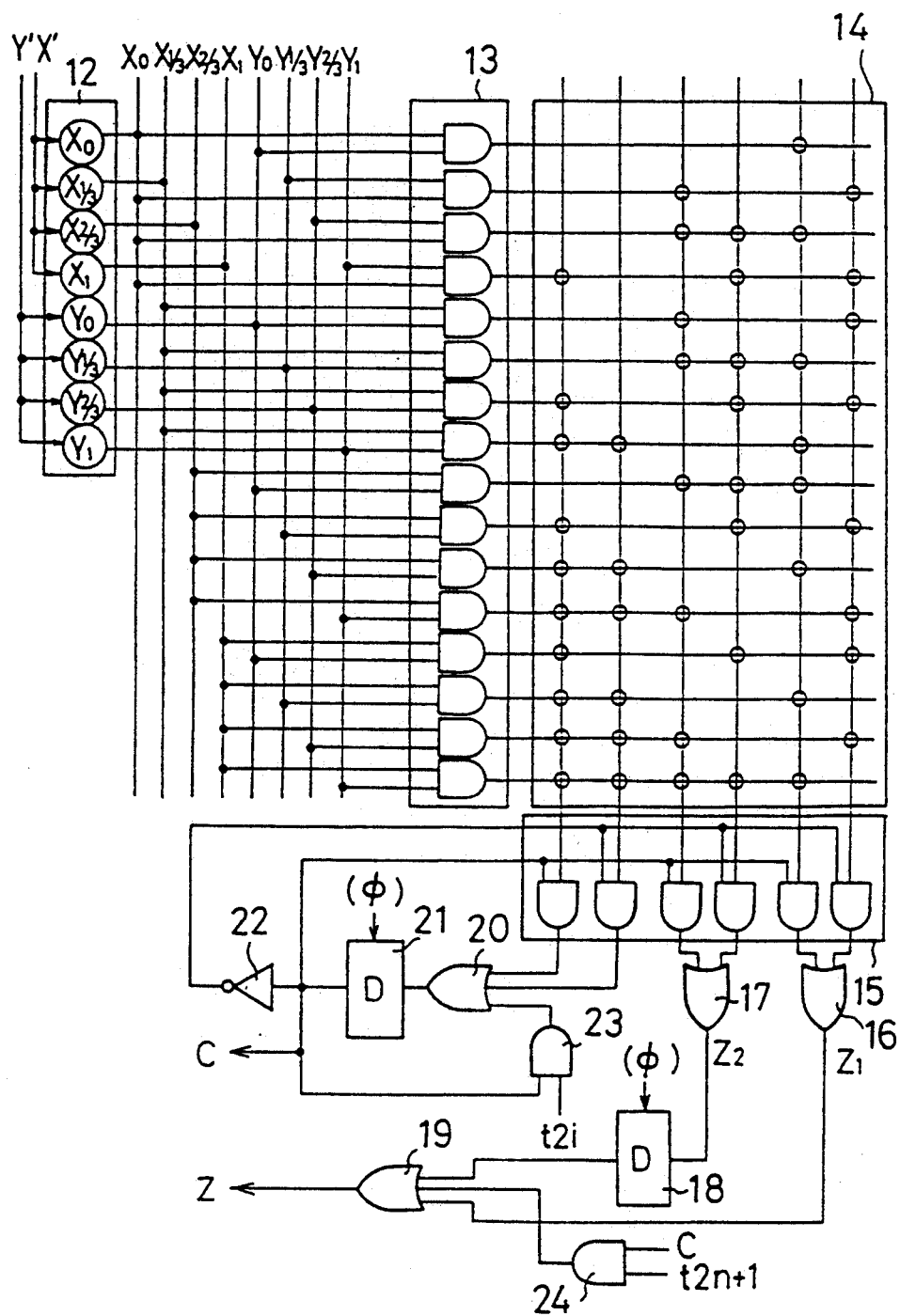
FIG. 1 is a circuit diagram of an adder circuit of an adder of a first embodiment according to the present invention.

FIG. 1 is a circuit diagram of the 2-bit parallel-serial adder mentioned above. In FIG. 1, reference numeral 12 denotes an equal-value circuit block. When $X'$ is 0, $\frac{1}{3}$, $\frac{2}{3}$ or 1, the bit $X_0$, $X_{\frac{1}{3}}$, $X_{\frac{2}{3}}$ and $X_1$ becomes 1 respectively, and when $Y'$ is 0, $\frac{1}{3}$, $\frac{2}{3}$, or 1, the bit $Y_0$, $Y_{\frac{1}{3}}$, $Y_{\frac{2}{3}}$ and $Y_1$ becomes 1 respectively. Data outputted from the equal-value circuit block 12 passes and AND circuit block 13, an OR circuit block 14, and an AND circuit block 15. From an OR circuit 16, Z1 is outputted, and from an OR circuit 17, Z2 is outputted. A logical conjunction between a time signal $t \, 2n+1$ from an AND circuit 24 and a carry output C is inputted to an OR circuit 19 in addition to Z1 and Z2 delayed one bit by a delay circuit 18. Finally, an addition result Z is obtained at the output of the OR circuit 19. The AND circuit 24 is used to add a carry to the logical disjunction between Z1 and Z2 when a carry is generated at time $t \, 2n+1$, that is, when a carry is generated in parallel addition on the most significant bits.

Figure 9:
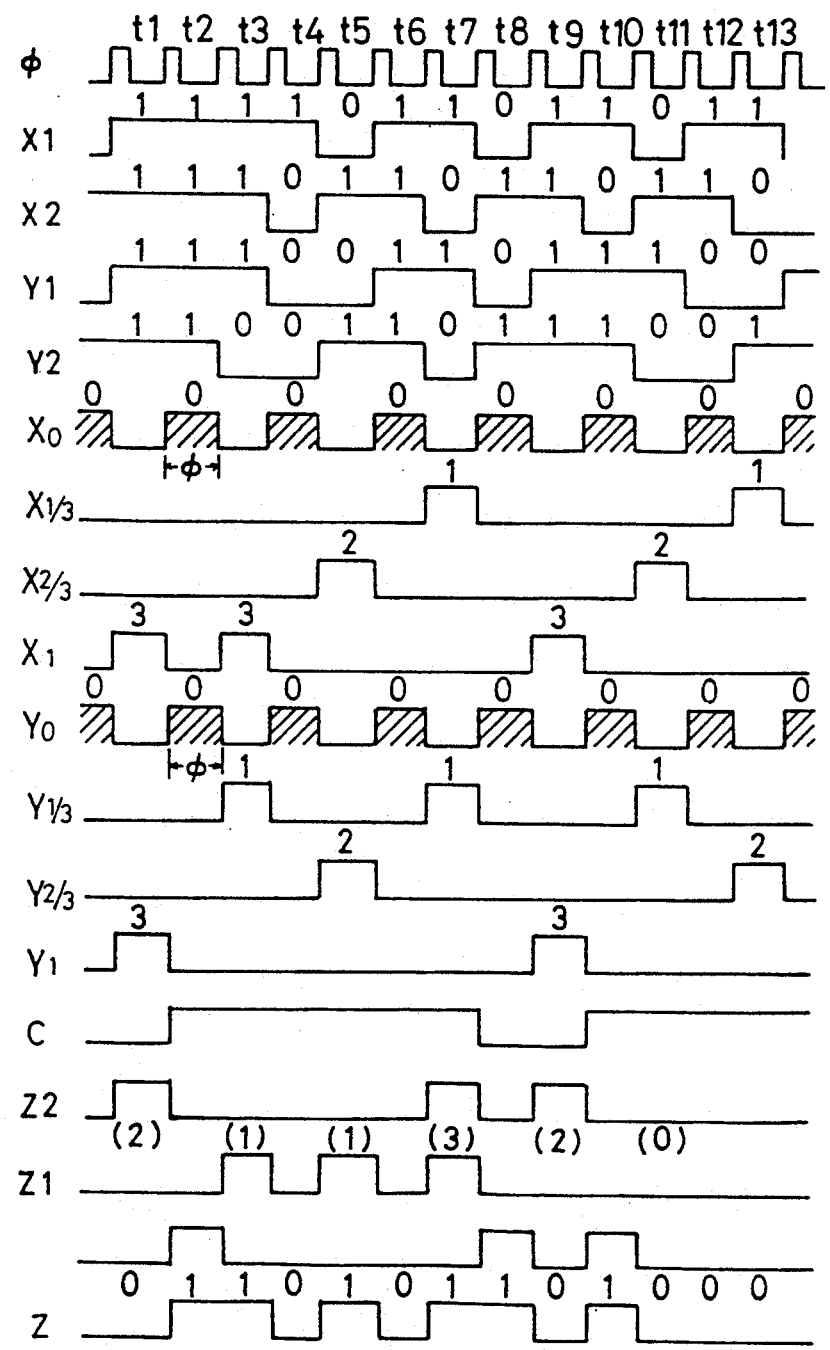
FIG. 9 is a diagram showing signal waveforms in the adder of FIG. 1.

An OR circuit 20 receives data from the AND circuit 15, and also receives a logical conjunction between a time signal $t \, 2i$ and a carry output from the lower stage. The output of the OR circuit 20 is delayed by one bit by a delay circuit 21 and supplied as a carry output C to the AND circuit 15. Further, the output of the OR circuit 20 is inverted by an inverter 22 and supplied as an inverted carry output to the AND circuit 15. FIG. 9 shows an example of waveforms of various signals in the above-mentioned adder. In FIG. 9, the hatched parts denote created time margin.

Description will now be made of a complete 2-bit parallel-serial type adder as a second embodiment of the present invention. In the above-mentioned adder as the first embodiment of the present invention, when two words each comprising 2n bits are added together, the operation time required for the addition is 2n-bit time, which is the same as in prior-art adders. However, since one addition is carried out for each period of $2\phi$ (two clock pulses), it is possible to obtain time margin, which improves the reliability of the operation. In contrast, the adder according to the second embodiment takes n-bit time as operation time, which means that the operation time is half as long as that of the prior-art adder.

The adder according to the second embodiment includes an X-register conversion block for separating a word X of 2n bits (X1, X2, ..., X2n) into a word of n bits (X1, X3, ..., X2n−1) including odd-number bits of the word X and a word of n bits (X2, X4, ..., X2n) including even-number bits of the word X, and a Y register conversion block for separating a word Y of 2n bits (Y1, Y2, ..., Y2n) into a word of n bits (Y1, Y3, ..., Y2n−1) including odd-number bits of the word Y and a word of n bits (Y2, Y4, ..., Y2n) including even-number bits of the word Y.

Figure 11:
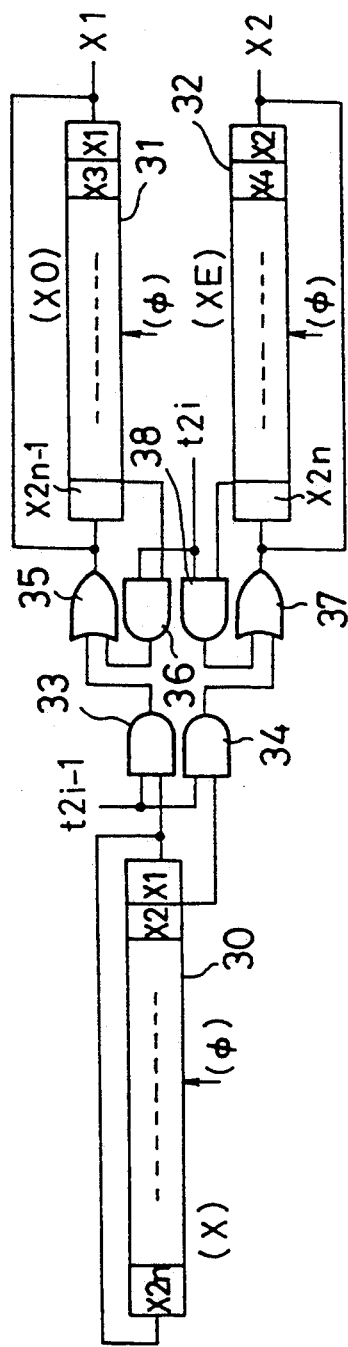
FIG. 11 is a circuit diagram of a register conversion circuit of the adder of FIG. 10.

FIG. 11 shows the structure of the X register conversion block, which includes a register 30 for storing the word X, an AND circuit 33 for receiving a time signal $t \, 2i-1$ and the output of the register 30, an AND circuit 34 for receiving a time signal $t \, 2i-1$ and a one-bit-early output from the register 30, an OR circuit 35 for receiving the outputs of the AND circuit 33 and the AND circuit 36, an OR circuit 37 for receiving the outputs of the AND circuit 34 and an AND circuit 38, a register 31 connected to the output of the OR circuit 35, and a register 32 connected to the output of the OR circuit 37. A time signal $t \, 2i$ is supplied to one input of each of the AND circuits 36 and 38, and the last data inputted to the register 31 is supplied to the other input. The register 31 stores a word of n bits (X1, X3, ..., X2n−1), while the register 32 stores a word of n bits (X2, X4, ..., X2n).

Figure 12:
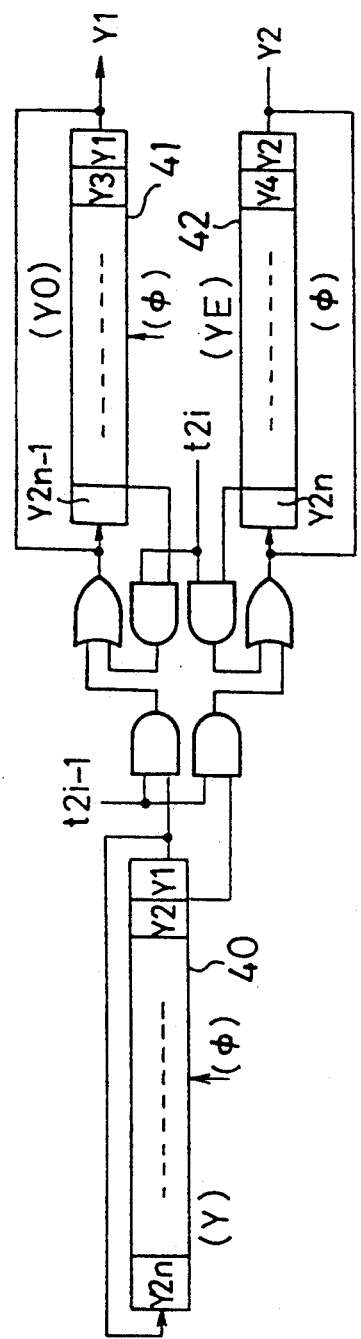
FIG. 12 is a circuit diagram of a register conversion circuit of the adder of FIG. 10.

FIG. 12 shows the structure of the Y register conversion block. As shown in FIG. 12, the Y register conversion block has the same structure as the X register conversion block. A word of 2n bits stored in the register 40 is separated into a word of n bits (Y1, Y3, ..., Y2n−1) and a word of n bits (Y2, Y4, ..., Y2n), and they are stored respectively in registers 41 and 42.

Figure 10:
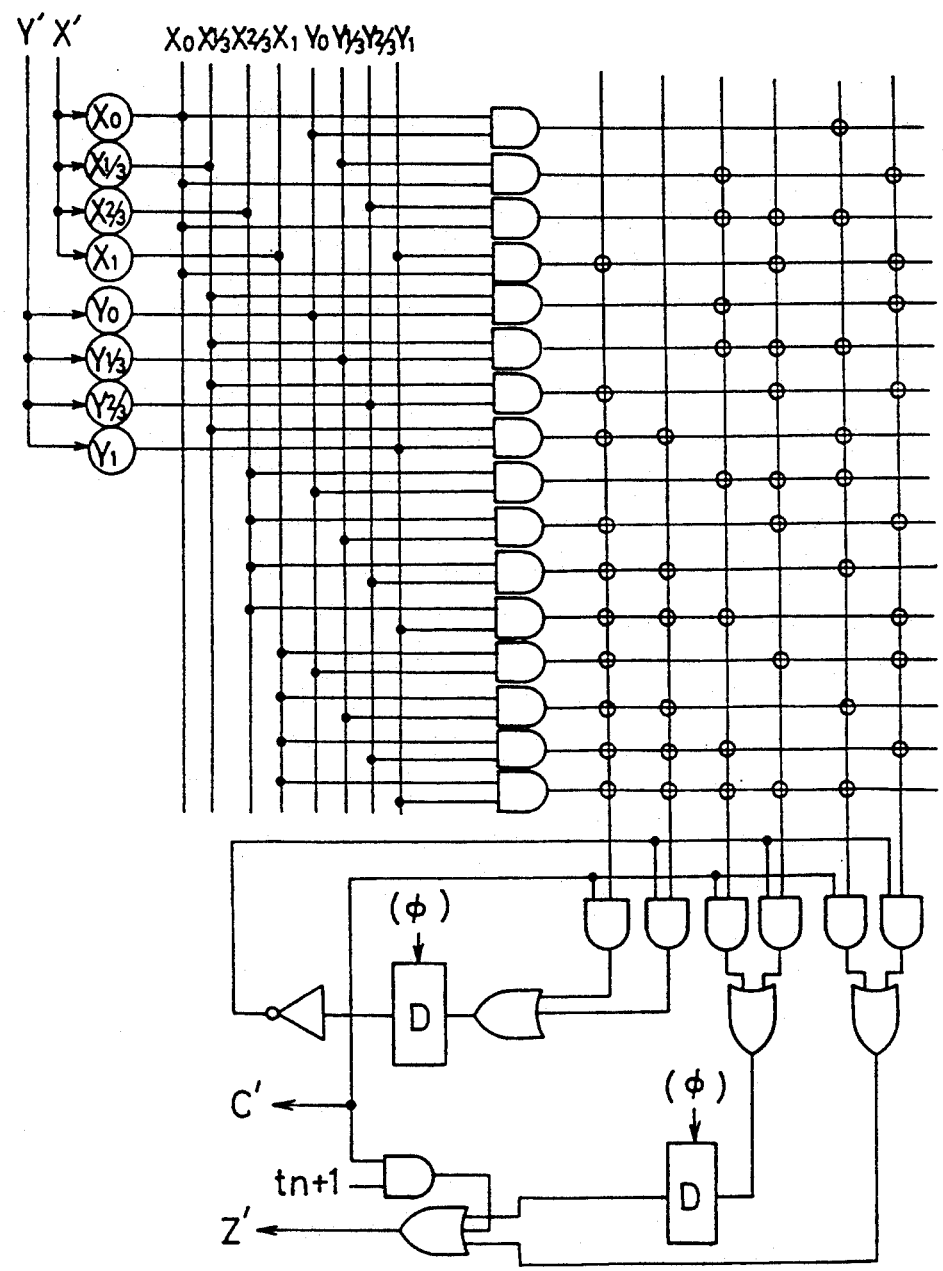
FIG. 10 is a circuit diagram of an adder circuit of an adder of a second embodiment according to the present invention.
Figure 13:
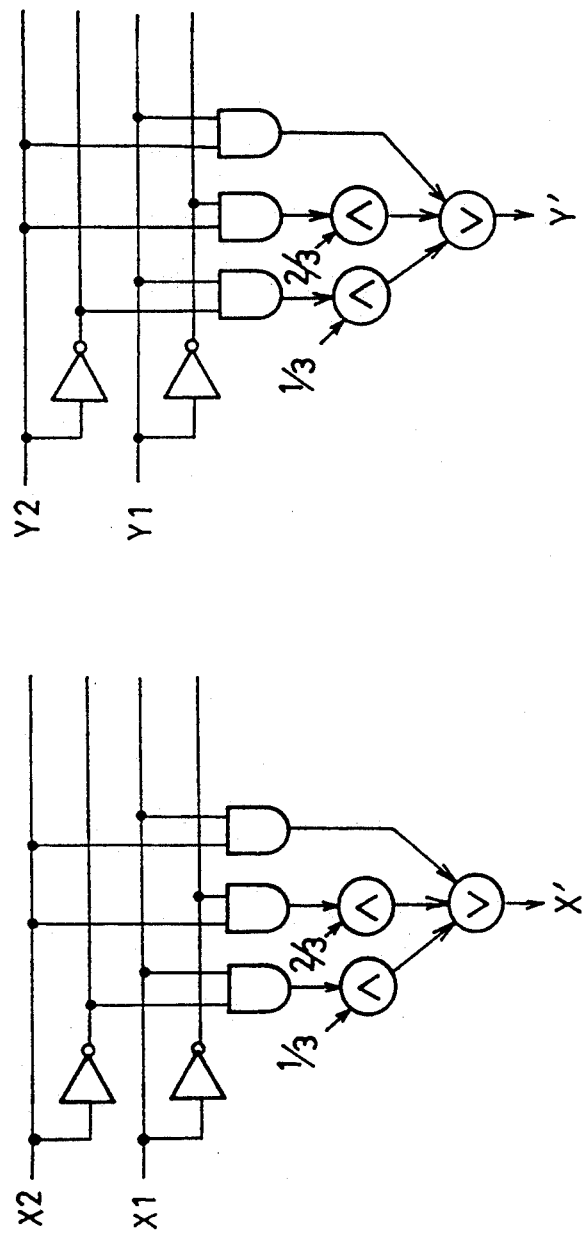
FIG. 13 is a circuit diagram of a binary-quaternary conversion circuit of the adder of FIG. 10.
Figure 14:
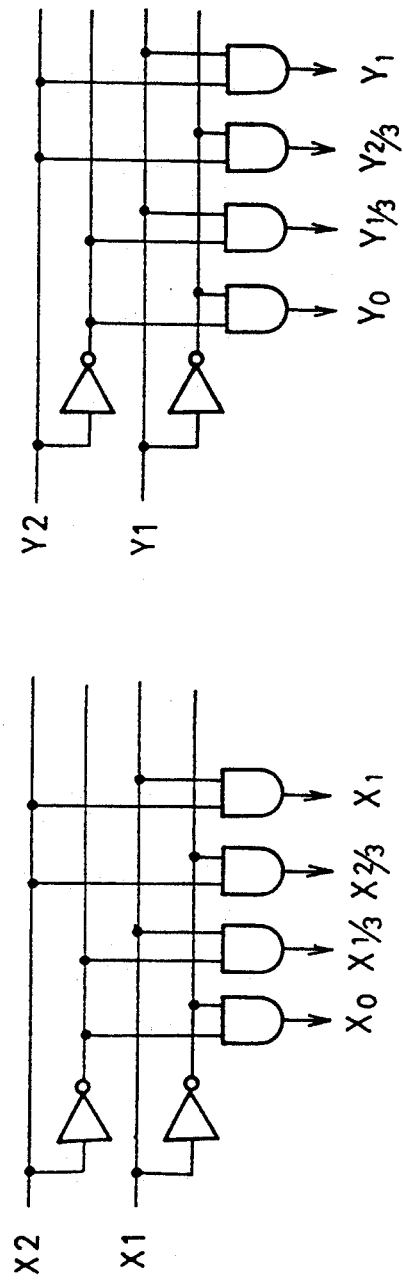
FIG. 14 is a circuit diagram of a binary input circuit of the adder of FIG. 10.

Serial outputs X1, X2, Y1, and Y2 from the registers 31, 32, 41 and 42 are inputted into binary-quaternary conversion circuits shown in FIG. 13. When the quaternary logic is not used, binary input circuits shown in FIG. 14 are used. Outputs $X'$ and $Y'$ from the binary-quaternary conversion circuit are added together by an adder circuit shown in FIG. 10, and an addition result $Z'$ and a carry output $C'$ can be obtained. In this addition circuit, a carry is generated at time $t \, i-1$, and the carry is added to a next addition input at time $t \, i$. Therefore, this addition circuit differs from that of FIG. 1 in the part where a carry output is generated.

Figure 15:
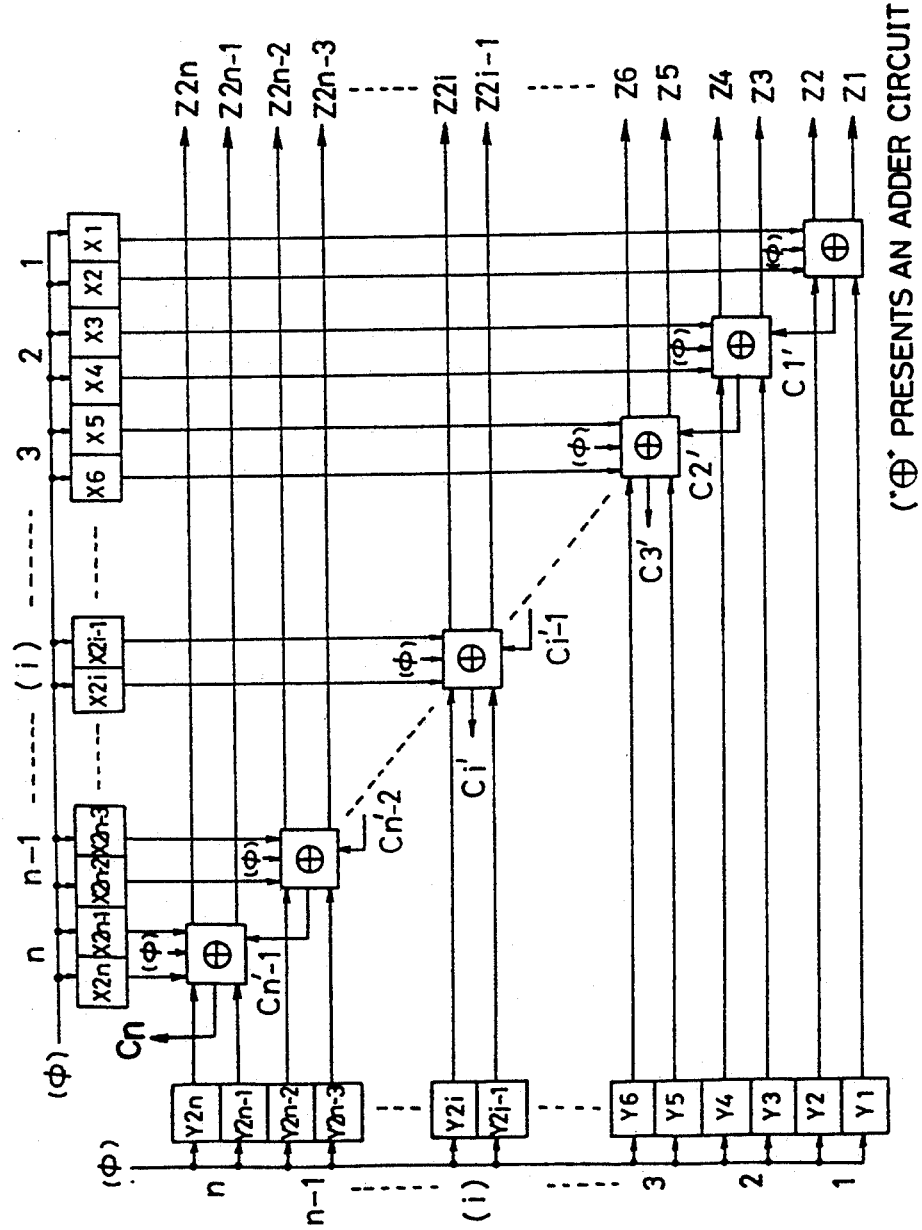
FIG. 15 is a circuit diagram of an adder of a third embodiment according to the present invention.
Figure 16:
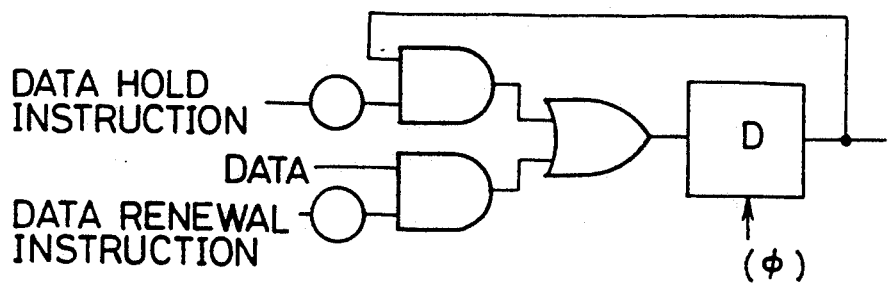
FIG. 16 is a circuit diagram of a data hold circuit of the adder of FIG. 15.

Description will now be made of a complete 2-bit parallel full-bit parallel type adder as a third embodiment of the present invention. As shown in FIG. 15, this adder comprises n pieces of adder circuits for adding a word X of 2n bits (X1, X2, ..., X2n) and a word Y of 2n bits (Y1, Y2, ..., Y2n) in blocks of two bits for all bits in parallel as shown in FIG. 15. Every bit data of the words X and Y is held during an add operation by a circuit shown in FIG. 16, which comprises AND circuits, an OR circuit and a one-bit-delay circuit.

Figure 17:
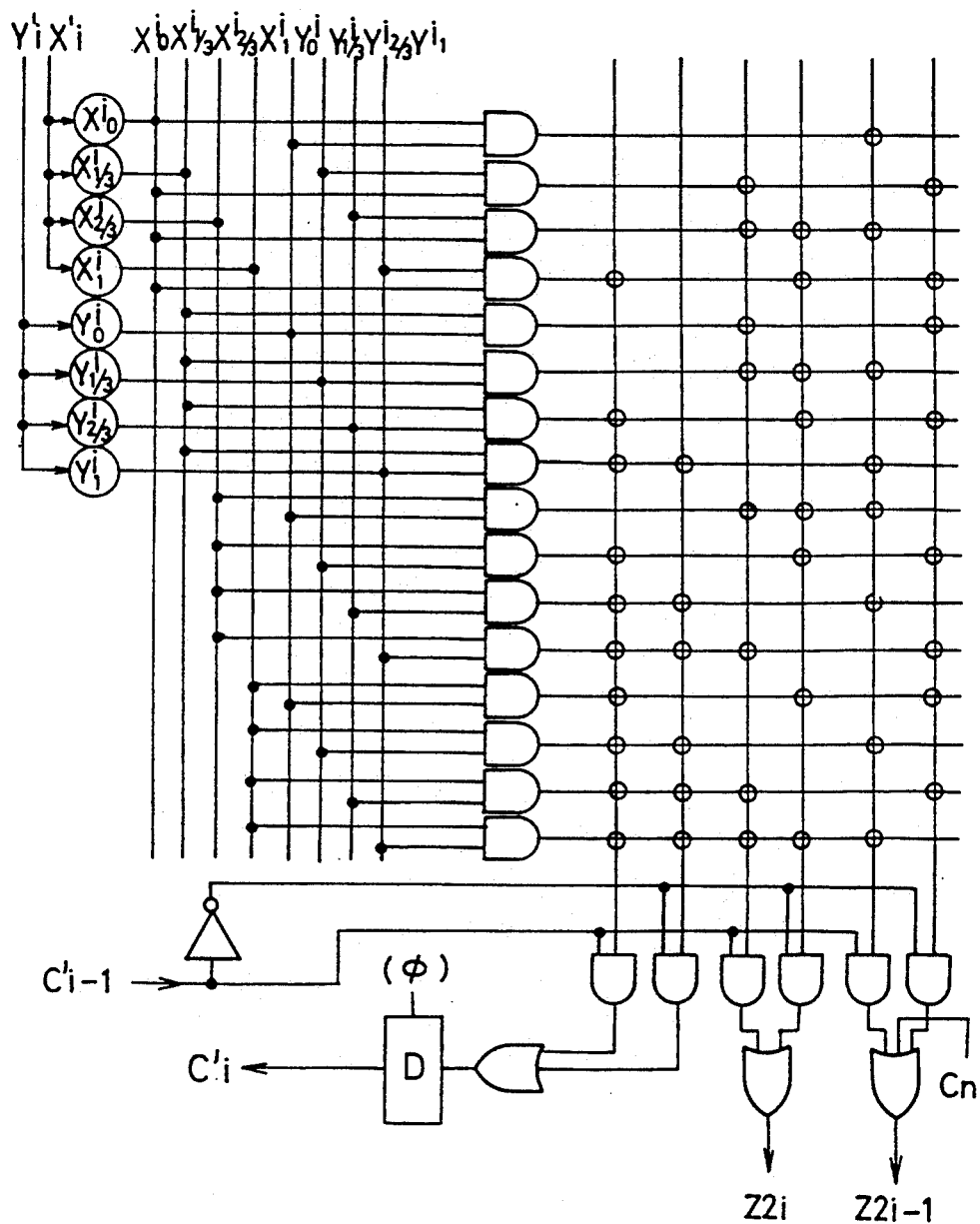
FIG. 17 is a circuit diagram of an addition circuit of the adder of FIG. 15.

FIG. 17 shows an adder circuit. As shown in FIG. 17, since there is a case in which a carry is generated in an addition operation on the most significant bits, a carry output Cn is inputted to an OR circuit which outputs $Z2i-1$. In FIG. 17, $C'i-1$ denotes a carry output from the lower stage, and $C'i$ denotes a carry input to the next stage.

Figure 18:
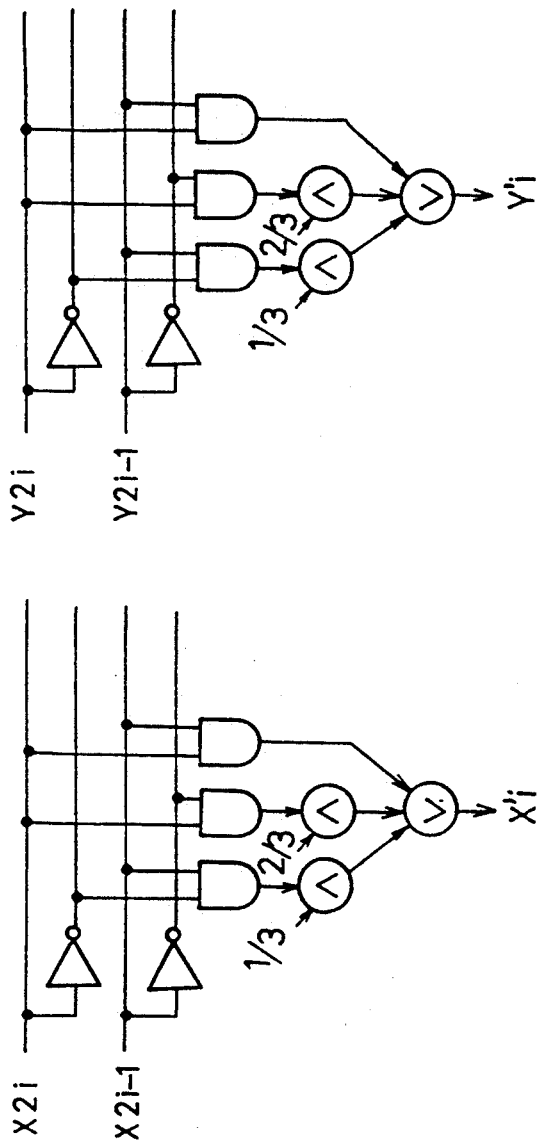
FIG. 18 is a circuit diagram of a binary-quaternary conversion circuit of the adder of FIG. 15.
Figure 19:
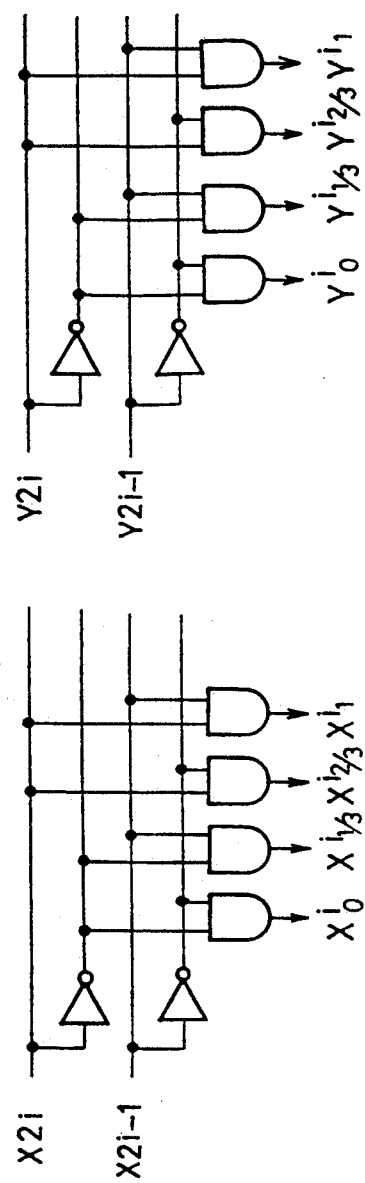
FIG. 19 is a circuit diagram of a binary input circuit of the adder of FIG. 15.

When the quaternary logic is used, each adder circuit comprises quaternary-binary conversion circuits shown in FIG. 18, while when the binary logic is used, each adder circuit comprises a binary input circuit shown in FIG. 19. The adders mentioned above can be used in both the quaternary logic and the binary logic. Further, they can be used in a combination of the quaternary logic and the binary logic. Use of the quaternary logic enables the number of signals to be reduced by half and is advantageous in making an adder as an LSI.

The adders according to the above-described embodiments carry out the carry processing only n/2 times for adding words of n bits. Therefore, the operation time is n/2-bit time which is half of the time required of the prior adders. In other words, the operation speed is twice the speed of the prior adders. Further, if the clock pulse frequency is reduced by half, it becomes possible to improve the stability of addition operation without reducing the operation speed.

Furthermore, by making an arrangement such that a parallel add operation is executed in blocks of four bits (that is, by using 16-valued logic), carry processing is carried out only n/4 times, thus making it possible to increase the addition speed to four times faster than in the prior adders. Similarly, by making an arrangement such that a parallel add operation is executed in blocks of three bits (that is, by using 8-valued logic), carry processing is performed only n/3 times, which means that the addition speed can be increased three times faster.

Figure 20:
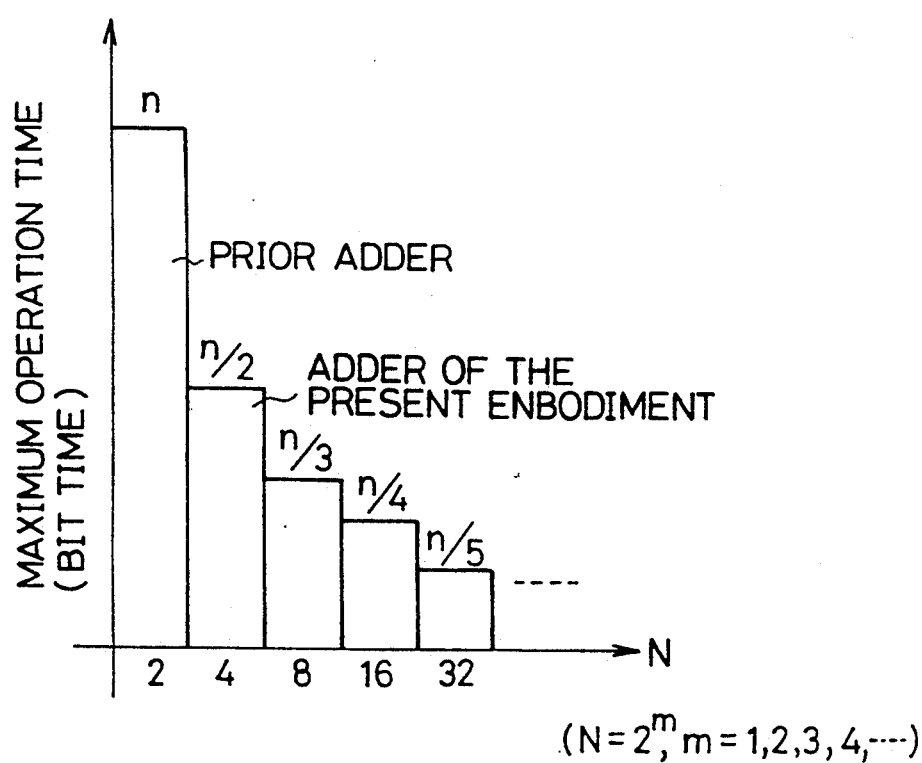
FIG. 20 is a graph showing bit time required to complete a parallel addition operation which changes in accordance with the number of steps of logic values.

The maximum operation time T (bit time) required for executing parallel addition of n-bit signals in N-valued logic ($N=2^m$) is expressed by $T \approx n/m = n \log 2/\log N$. The relation between the maximum operation time and the number N is shown in FIG. 20. As can be seen from FIG. 20, the greater the number N, the shorter the operation time and the faster the operation speed. However, the circuit size increases with the increase of the number N. With this disadvantage taken into account, use of four-valued logic is most practical. It should be noted that if an arrangement is made such that a complement of an addend is added, the adder according to the present invention can be used as a subtracter.

Many widely different embodiments of the present invention may be constructed without departing from the spirit and scope of the present invention. It should be understood that the present invention is not limited to the specific embodiments described in the specification, except as defined in the appended claims.

What is claimed is:

1. An adder for outputting a sum of an addend and an augend of binary logic, comprising:

subdividing means for subdividing an addend and an augend of binary logic into bit groups each having a specified number of bits to be represented by one digit of multi-valued logic;

binary-multivalue conversion circuits for converting one bit group of each of an addend and an augend of binary logic to one digit of each of an addend and an augend of multi-valued logic;

an equal-value circuit, connected to receive said one digit of each of the addend and the augend of multi-valued logic, for converting the received one digit of each of the addend and the augend to data of plural bits, each bit of said data having two states and representing a respective one logical level of the multi-valued logic, so that one bit of data converted from the received one digit of each of the addend and the augend is to be set at one state according to a level thereof; and addition means, connected to receive said data converted from the one digit of each of the addend and the augend, for executing a logical operation in binary logic between received data so that a result of the logical operation represents a sum of one bit group of the addend and a corresponding one bit group of the augend of binary logic, and for outputting said result of the logical operation in binary logic.

2. An adder according to claim 1, wherein said addition means includes a logical operation means for generating a carry signal, and another logical means for adding the carry signal from a lower group to the sum of one bit group of the addend and a corresponding one bit group of said augend.

3. An adder according to claim 1, wherein said subdividing means includes supplying means for supplying one bit group of each of the addend and augend from a least significant bit group in succession to said binary-multivalue conversion circuit.

4. An adder according to claim 1, wherein said subdividing means includes a register for storing each of the addend and the augend of binary logic, each register simultaneously outputting said specified number of bits and shifting output bits by one bit in synchronism with a clock.

5. An adder according to claim 1, wherein said subdividing means includes a number of registers equal in number to the bits of one bit group, each register storing a respective one bit of each bit group and outputting one bit in succession in synchronism with a clock, so that bit groups are outputted sequentially.

6. An adder according to claim 1, wherein said addition means includes a plurality of adder circuits for executing parallel additions for each bit a group at a time.

7. An adder according to claim 1, wherein said subdividing means subdivides each of an addend and an augend of binary logic into bit groups each having two bits and said binary-multivalue conversion circuit converts one bit group of each of an added and an augend of binary logic to one digit of each of an addend and an augend of quaternary logic.

8. An adder according to claim 7, wherein said equal-value circuit converts one digit of quaternary logic into data of four bits.

9. An adder according to claim 7, wherein said addition means executes the logical operation between four bits converted from one digit of the addend and four bits converted from one digit of the augend and outputs two bits of binary logic.

* * * * *